United States Patent [19]

Burr

[11] Patent Number: 4,555,680

[45] Date of Patent: Nov. 26, 1985

[54] MAGNETRON TUNED PROGRAMMABLY USING STEP MOTOR

[75] Inventor: John E. Burr, Wenham, Mass.

[73] Assignee: M/A-COM, Inc., Burlington, Mass.

[21] Appl. No.: 510,664

[22] Filed: Jul. 5, 1983

[51] Int. Cl.[4] .......................... H03B 9/10; H03B 5/40; H01J 25/50

[52] U.S. Cl. ........................................ 331/86; 331/90; 331/154; 331/157; 315/39.55; 315/39.59; 315/39.61

[58] Field of Search .................... 331/86, 90, 154, 157; 315/39.55, 39.59, 39.61

[56] References Cited

U.S. PATENT DOCUMENTS

| | | | |
|---|---|---|---|
| 3,154,717 | 10/1964 | Boyd et al. | 315/39.61 |
| 3,441,794 | 4/1969 | Chun | 331/90 |
| 3,441,795 | 4/1969 | Hynes et al. | 331/90 |
| 3,441,796 | 4/1969 | Cooper | 331/90 |
| 4,131,825 | 12/1978 | Mattsson | 315/39.61 |
| 4,281,273 | 7/1981 | Baker | 315/39.59 X |

*Primary Examiner*—Eugene R. LaRoche

*Assistant Examiner*—D. C. Mis

*Attorney, Agent, or Firm*—Wolf, Greenfield & Sacks

[57] ABSTRACT

A resonant-cavity type electronic tube having mechanically-operable tuning vanes associated with its resonant-cavity structure and disposed within an evacuable envelope. A support member is provided within the envelope for adjusting the tuning vanes relative to the resonant-cavity structure, so as to tune the frequency of resonance of the structure step-wise in accordance with a predetermined program. The tuning is carried out with a step motor, having a stator and armature with the envelope having a portion extending between the stator and armature for enclosing the armature within the evacuable space containing the tuning vanes and the resonant cavity structure. The armature is coupled to the tuning vanes for altering the position thereof relative to the resonant-cavity structure in fixed relation to the displacement of the armature relative to the stator. Electrical signals are coupled to the stator for establishing a programmable series of displacements of the armature relative to the stator.

5 Claims, 7 Drawing Figures

MAGNETRON TUNED PROGRAMMABLY USING STEP MOTOR

INTRODUCTION

Resonant-cavity type electron tubes, such as magnetrons and backward-wave oscillators, typically employ a resonant-cavity anode structure adjacent a cathode with a magnetic field traversing the space between them. The resonance frequency of the cavity structure can be altered (for tuning the tube over a range of frequencies) by changing the inductance, the capacitance, or both with mechanical or electrical means. This invention relates to improvements in mechanical tuning means. More particularly, the invention relates to programmable step-wise tuning means, for example, in a magnetron, for setting the resonance-frequency of the resonant-cavity structure in discrete steps, which steps can, if desired, be altered according to a program intended to accomplish a particular result.

BACKGROUND OF THE INVENTION

Mechanical tuning devices for magnetron tubes and the like physically alter the resonant structure of the tube. In most cases known in the art a bellows or diaphragm structure is provided in the vacuum-enclosing envelope of the tube and through it linear motion is provided to the tuning mechanism from outside the envelope. Bellows are always potentially the vacuum failure mode in a magnetron tuner, particularly where rapid tuning is required.

In another type of tuning mechanism, sometimes called a "Spin-Tuned" magnetron, a rotatable operator outside the envelope is magnetically coupled through the envelope to rotate a tuning cylinder inside the envelope; this mechanism provides random tuning with the resonance frequency being altered according to a sinusoidal function. A specific frequency of oscillation, or a specific tuning profile, cannot be pre-set with the Spin-Tuned mechanism. Moreover, the operator moves the magnetic lines of force with respect to the portion of the envelope which is placed between the driving and driven elements, inducing currents in that portion of the envelope which create opposite magnetic poles. The introduction of a magnetic material between the driving and driven elements in that operating configuration would shunt the lines of force and impair the operation of the device.

It is the object of this invention to provide a means to rapidly tune a resonant-cavity electron tube, such as a magnetron, to a specific frequency, or to program a specific profile of frequencies, without resorting to the use of bellows or diaphragms.

It is another object of the invention to provide an operator for such tuning means having a driving element outside the vacuum-enclosing envelope of the tube and a driven element inside the envelope with a portion of the envelope between them in which no induced current is set up in said portion of the envelope. More particularly, it is an object of the invention to provide such an operator which places its magnetic lines of force at a fixed position relative to the said portion of the envelope.

A further object of the invention is to provide such an operator in which magnetic material can be incorporated into said portion of the envelope between the driving and driven elements without risk of cutting lines of magnetic force between said elements, and which can be operated with minimum power.

GENERAL DESCRIPTION OF THE INVENTION

According to the invention, mechanically-operable tuning means can be adjusted step-wise within the vacuum envelope by means of a step motor having a stator outside the envelope in a fixed position relative to the envelope and an armature inside the envelope connected to the tuning means. A programmed electrical signal applied to the stator is effective to adjust the frequency of the electron tube step-wise in accordance with a predetermined program of frequencies. Magnetizable material incorporated in the portion of the envelope between the stator and the armature, adjacent pole-faces of the stator, enhances the strength of the stator magnetic field within the envelope, closer to the armature, without cutting lines of magnetic force.

BRIEF DESCRIPTION OF THE DRAWINGS

The invention is exemplified by a magnetron which is illustrated in the accompanying drawings, in which.

DETAILED DESCRIPTION OF THE DRAWINGS

Figure 1:
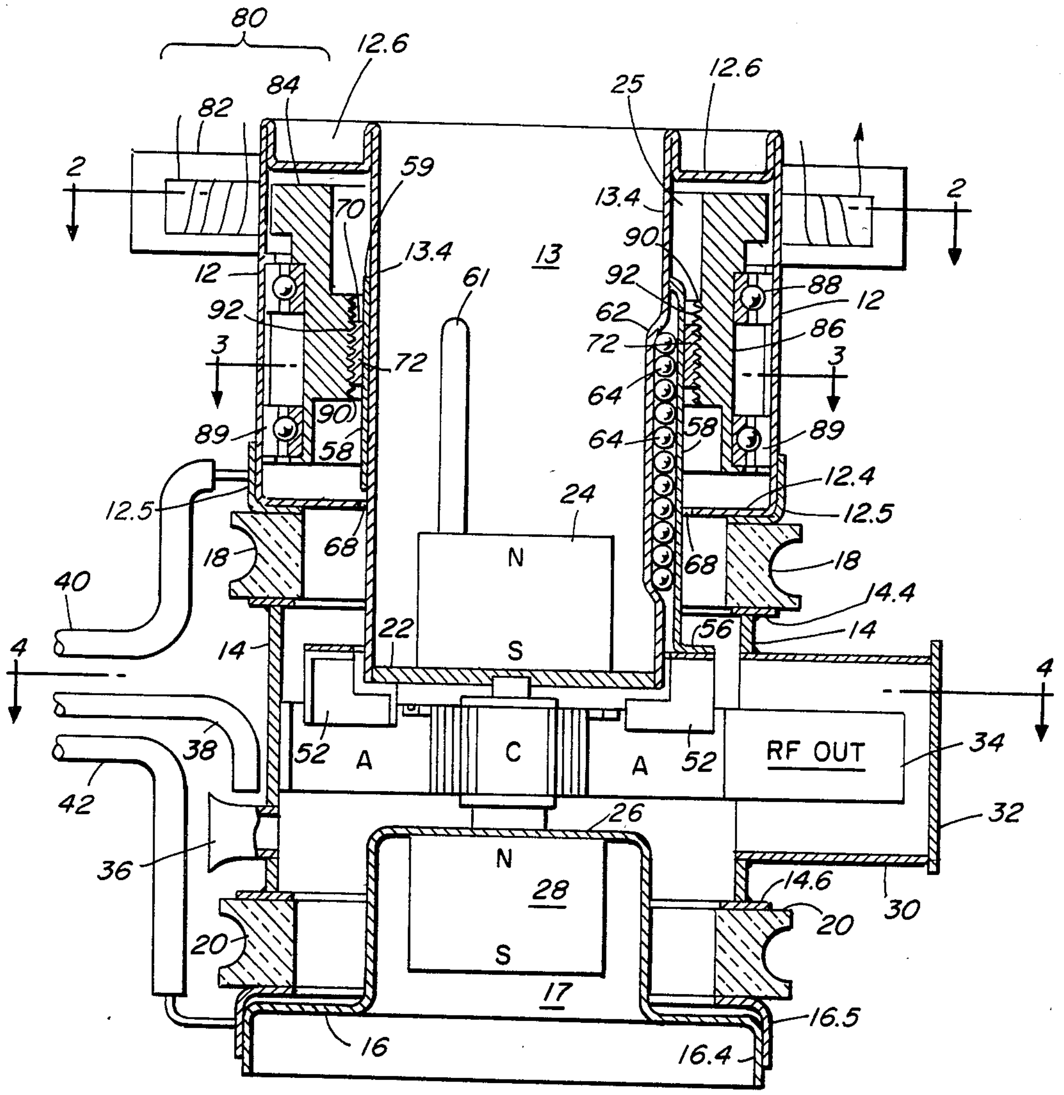
FIG. 1 is an axial section through the magnetron.

The illustrated magnetron has a vacuum-enclosing envelope made in three electrically-conductive parts 12, 14, 16, respectively, separated electrically from each other by first and second insulator rings 18 and 20 of electrically non-conductive material. The first envelope part 12 (upper part in FIG. 1) consists of an outer shell which is attached at one end 12.4 via an attaching ring 12.5 to the outer side of the first insulator ring 18, from which it extends (upwardly in FIG. 1) to an extremity 12.6 where it turns back re-entrantly to form a deep first cup 13 concentrically located within and spaced from the outer shell. The bottom wall 22 of the first cup 13 is a seat for a first external permanent magnet 24. The annular space 25 between the outer shell of the enclosure 12 and the concentrically located inner wall 13.4 of the first cup 13 is within the vacuum enclosure and provides space for tuning means according to the invention which will be described below.

The third envelope part 16 is formed as a second cup 17 which is attached at one end 16.4 via an attaching ring 16.5 to the outer side of the second insulator ring 20. The bottom wall 26 of the second cup 17 is a seat for a second external permanent magnet 28.

The second envelope part 14 is a tubular shell located between the first and third envelope parts 12, 16, attached at its respective axial ends via attaching rings 14.4 and 14.6 to the inner sides of the first and second insulator rings 18 and 20, respectively. A cavity-anode A is fixed within the second envelope part 14, and a coaxially-located cathode C is mounted between the magnet seats 22 and 26. An output port 30, sealed with a microwave-energy transparent window 32 is fitted to the second envelope part 14, and an RF output coupling 34 from the anode is located in the output port. An exhaust tubulation 36 for evacuating the envelope is fitted to the second envelope part, and a conductor 38 for applying anode voltage is connected to this tubulation. Cathode heater current for the cathode C is applied via two conductors 40, 42 which are connected to the first and third envelope parts 12, 16, respectively.

Figure 2:
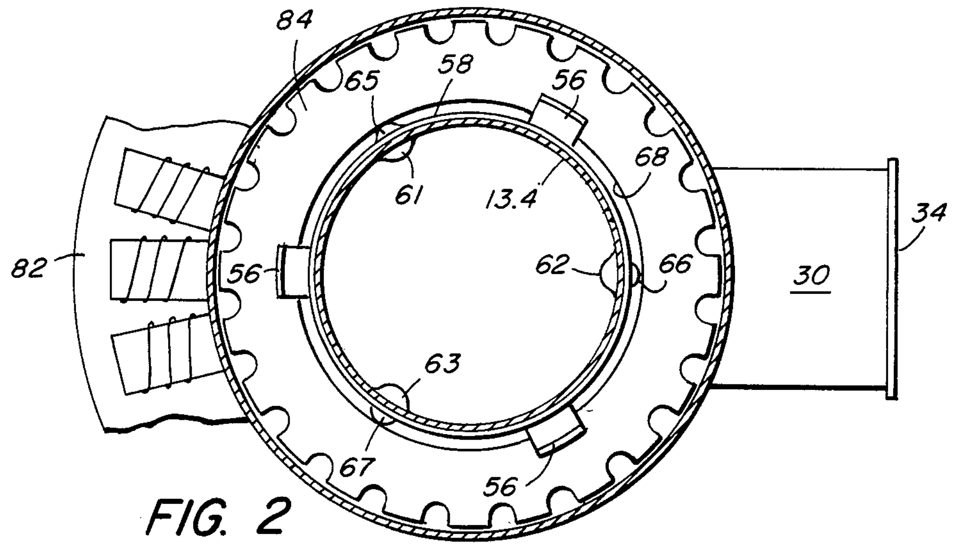
FIG. 2 is a transverse section taken on line 2—2 in FIG. 1.
Figure 3:
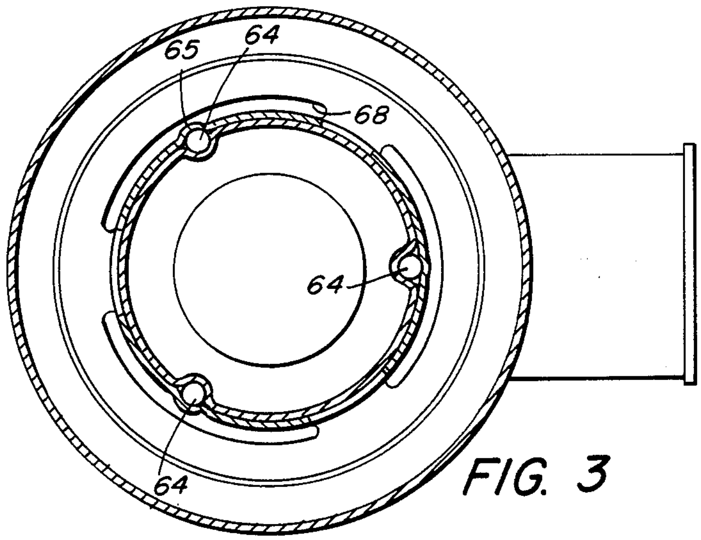
FIG. 3 is a transverse section taken on line 3—3 in FIG. 1.
Figure 4:
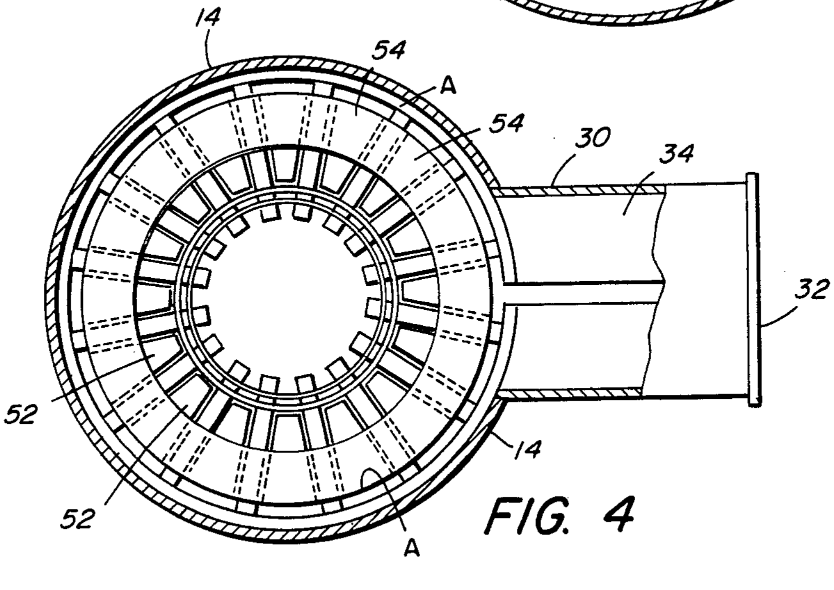
FIG. 4 is a transverse section taken on line 4—4 in FIG. 1.

The magnetron is tunable by vanes 52 arranged in a "crown-of-thorns" circular configuration which are movable axially to penetrate adjustably into the respective anode cavities 54. According to the present invention, the vanes can be moved relative to the cavities rapidly and precisely so as to rapidly tune the magnetron to a specific frequency, or to program a specific profile of frequencies, with penetration control means located entirely within the vacuum-enclosing envelope, without resorting to the use of bellows or diaphragms. The vanes are fixed to fingers 56 extending from a tubular support 58 which embraces the wall 13.4 of the first cup 13 inside the annular space 25. The tubular support is movable along the cup wall 13.4 linearly in an axial direction only, being restrained against circumferential motion by three circumferentially-equally-spaced axially-elongated indentations 61, 62, 63 in the cup wall, which form grooves for anti-friction ball-bearings 64. The tubular support 58 has three matching outwardly-dented grooves 65, 66, 67 (see FIG. 2) which together with confronting indentations 61, 62, 63, respectively, from elongated cages for respective linear-arrays of ball bearings. This arrangement allows the tubular support 58 to move freely in the annular space 25 on the cup wall 13.4, while restricting the tubular support 58 against motion around the cup wall, in a circumferential direction.

The end 12.4 (lower end in FIG. 1) of the first envelope part 12 which attaches to the first insulator ring 18 is turned radially inward toward the first cup wall 13.4, but stops short of reaching that wall, leaving an annular groove space 68 through which the tuner support 58 can execute linear axially-directed motion. A boss 70 of annular shape, bearing screw threads 72 on its outer surface, is fixed to the tubular support 58 nearer to its upper extremity 59 (as seen in FIG. 1).

A step motor 80, having a stator 82 fixed to the outside of the first envelope part 12, and an armature 84 rotatably mounted inside the first envelope part, in the annular space 25, provides a tuning control means according to the invention. The armature 84 is carried on a circumferentially-rotatably armature tube 86 mounted within the first envelope part 12 on bearings 88, 89. An inner annular boss 90 is carried by the armature tube, and it bears screw threads 92 on its inner surface, for mating with the screw threads 72 carried by the axially-movable support 58 for the tuning vanes 52. When the armature tube 86 is rotated, the circumferential motion of its screw threads 90 is translated into axially-directed motion of the tuner support tube 58. This motion is precisely controllable in discrete quantitative steps, rapidly, by means of the step motor 80.

In general, the operation of a step motor consists of discrete motions of essentially uniform magnitude, rather than continuous motion as is found, for example, in spin-tuned magnetrons of the prior art. In step motors, control of the desired discrete motions depends in part on the spacing between the stator and the armature, and the need to increase that spacing in order to locate a part of the envelope 12 between them for the purposes of the present invention could weaken both precision and speed of tuning control. According to the present invention, step motors are modified to permit fast, precise tuning control through the envelope part 12, without requiring increased power to operate the step motor.

Figure 5:
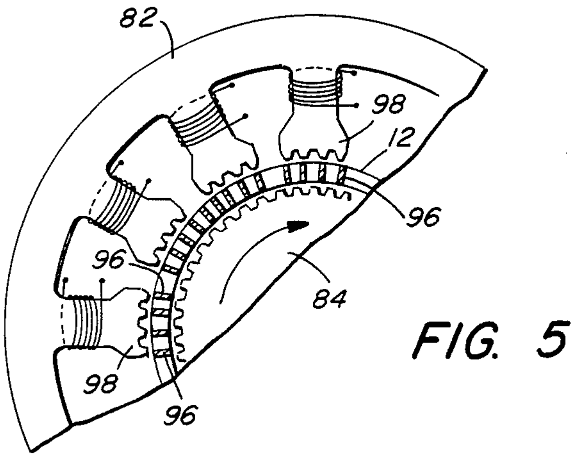
FIG. 5 is a partial transverse section through a step motor modified according to the invention to include magnetizable material adjacent the stator pole pieces in the envelope wall portion between stator and armature.
Figure 6:
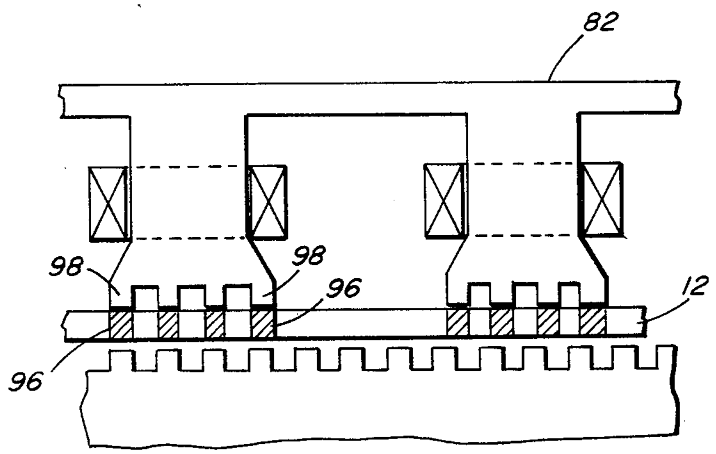
FIG. 6 illustrates the principles employed in FIG. 5 as applied to a linear motor.
Figure 7:
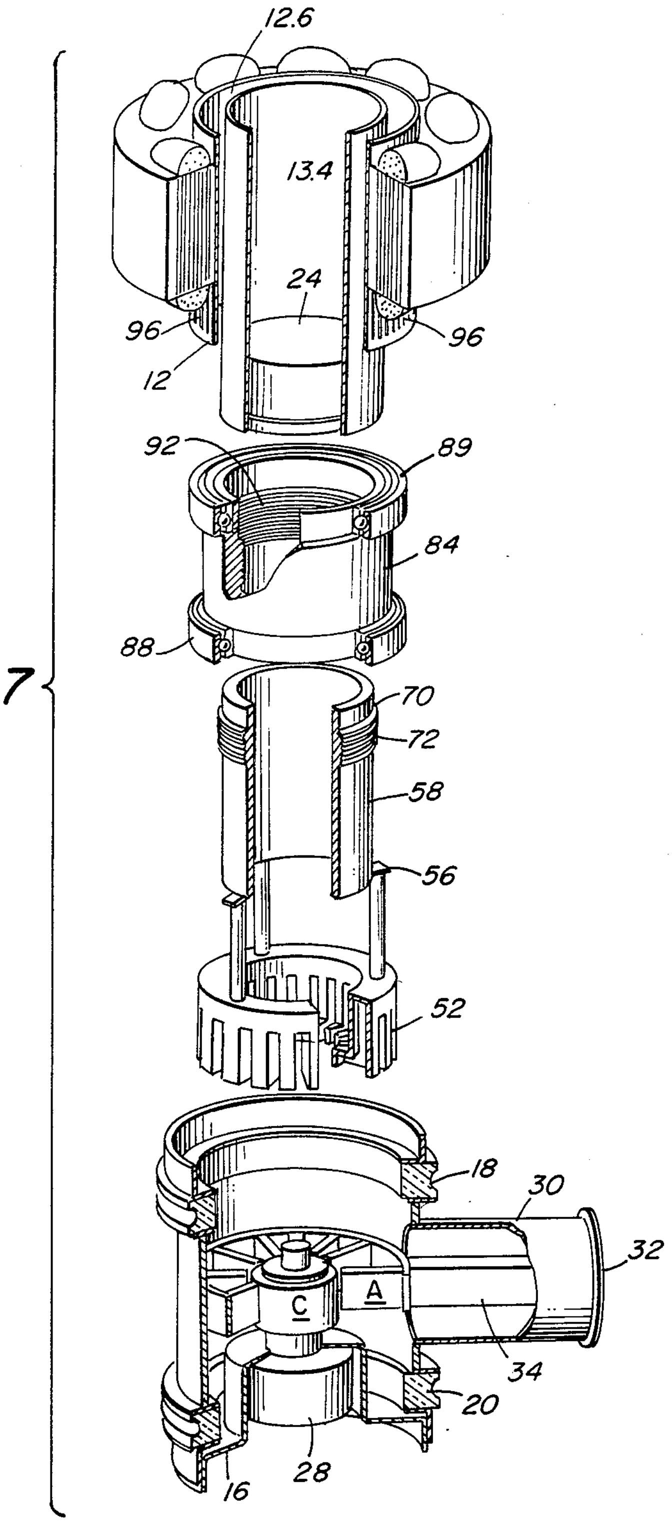
FIG. 7 is an exploded view of operator and tuner components similar to those in FIG. 1.

Referring to FIGS. 5 and 6, a motor of multi-tooth form is illustrated, as exemplary. The stator 82 and armature 84 are separated by a portion of the envelope part 12. The primary material of the envelope is nonmanetic (e.g.: copper). Segments 96 of magnetic material (shown also in FIG. 7) are fixed in and preferably through the envelope wall 12, one segment being adjacent each tooth 98 of the stator. The envelope wall 12 is fixed relative to the stator, so that each magnetic-material segment is, in effect, an extension of the adjacent pole tooth 98 into the annular space 25 to a close proximity to the armature 84. With the arrangement, all possibility of motion of magnetic lines of force with respect to the material (envelope wall 12) which is placed between the driving and driven motor elements 82, 84, respectively, is virtually eliminated. The present invention places the magnetic lines of force at a fixed position relative to the first envelope part 12, and the further improvement using segments of magentic material adjacent the stator poles carries fixed lines of force through the envelope wall into the evacuated space. Rotation of the armature 84 is obtained by sequentially switching or amplitude varying adjacent stator poles. No lines of force are cut, and no induced currents are set up in the envelope wall. Power required to operate the step motor 80 with desired precision is held to a minimum.

What is claimed is:

1. A resonant-cavity type electron tube having a mechanically-operable tuning means associated with the resonant-cavity structure within an evacuable envelope, means within said envelope for adusting said tuning means relative to said resonant-cavity structure so as to tune the frequency of resonance of said structure step-wise in accordance with a predetermined program, said adjusting means comprising a step motor having a stator and armature, said envelope having a portion extending between said stator and said armature for enclosing said armature within the evacuable space containing said tuning means and said resonant-cavity structure, means coupling said armature to said tuning means for altering the position of said tuning means relative to said resonant-cavity structure in fixed relation to the displacement of said armature relative to said stator, means to couple said armature to said stator magnetically through said portion of said envelope, and means to provide electrical signals to said stator for establishing a programmable series of displacements of said armature relative to said stator, in which said portion of said envelope between said stator and said armature is fixed relative to said stator and includes inserts of readily-magnetizable material located adjacent pole-faces of said stator for enhancing the strength of the stator magnetic field within said envelope.

2. An electron tube according to claim 1 wherein said motor means comprises a step motor for providing step-wise programming.

3. A mechanically-tunable magnetron having in a common evacuable envelope a resonant-cavity type anode and a mechanical tuning structure that is movable relative to said anode, and frequency-setting means external to said envelope for step-wise moving said tuning structure relative to said anode for tuning said magnetron in discrete resonance-frequency steps, said frequency setting means comprising a step motor having a stator and an armature, said envelope having a portion extending between said stator and said armature for enclosing said armature within said envelope, means within said envelope connecting said armature to said tuning structure for tuning said magnetron in response to displacement of said armature within said envelope, means to couple said armature to said stator magnetically through said portion of said envelope, and means to provide electrical signals to said stator to effect step-wise displacement of said armature relative to said stator, said stator being fixed relative to said envelope, and including sections of readily magnetizable material in said envelope adjacent pole faces of said stator for enhancing the strength of the stator magnetic field within said envelope.

4. A magnetron according to claim 3 including means within said envelope mounting said armature for rotary motion relative to said envelope portion, and means within said envelope mounting said tuning structure for motion restricted to movement in a linear direction so as to adjust penetration of tuning components in anode cavities, said means connecting said armature to said tuning structure including motion-changing means coupling said armature to said tuning structure for converting said rotary motion of said armature to linear movement of said tuning structure.

5. A resonant-cavity type electron tube having a mechanically-operable tuning means associated with the resonant-cavity structure within an evacuable envelope, means within said envelope for adjusting said tuning means relative to said resonant-cavity structure, so as to tune the frequency of resonance of said structure in accordance with a predetermined program, said adjusting means comprising a motor means having a stator and armature, said envelope having a portion extending between said stator and said armature for enclosing said armature within the evacuable space containing said tuning means and said resonant-cavity structure, means coupling said armature to said tuning means for altering the position of said tuning means relative to said resonant-cavity structure in fixed relation to the displacement of said armature relative to said stator, means to couple said armature to said stator magnetically through said portion of said envelope, and means to provide electrical signals to said stator for establishing a programmable displacement of said armature relative to said stator, in which said portion of said envelope between said stator and said armature is fixed relative to said stator and includes inserts of readily-magnetizable material located adjacent pole-faces of said stator for enhancing the strength of the stator magnetic field within said envelope.

* * * * *